(12) United States Patent
Choi et al.

(10) Patent No.: US 9,972,590 B2
(45) Date of Patent: May 15, 2018

(54) SEMICONDUCTOR PACKAGE HAVING A SOLDER-ON-PAD STRUCTURE

(71) Applicant: Avago Technologies General IP (Singapore) Pte. Ltd., Singapore (SG)

(72) Inventors: Deog Soon Choi, Seoul (KR); Ah Ron Lee, Seoul (KR); Hyun-Mo Ku, Seoul (KR)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days. days.

(21) Appl. No.: 15/202,195

(22) Filed: Jul. 5, 2016

(65) Prior Publication Data

US 2018/0012856 A1 Jan. 11, 2018

(51) Int. Cl.
*H01L 23/52* (2006.01)
*H01L 23/00* (2006.01)
*H01L 23/498* (2006.01)

(52) U.S. Cl.
CPC ........ *H01L 24/09* (2013.01); *H01L 23/49838* (2013.01); *H01L 24/17* (2013.01); *H01L 2224/0912* (2013.01); *H01L 2224/0951* (2013.01); *H01L 2224/175* (2013.01); *H01L 2224/1712* (2013.01)

(58) Field of Classification Search
CPC .............................................. H01L 2924/15311
See application file for complete search history.

(56) References Cited

U.S. PATENT DOCUMENTS

| | | | | |
|---|---|---|---|---|
| 5,569,960 A | * | 10/1996 | Kumazawa | H01L 23/3128 257/738 |
| 6,291,775 B1 | * | 9/2001 | Saitoh | H01L 21/563 174/250 |
| 6,316,289 B1 | | 11/2001 | Chung | |
| 6,683,387 B1 | * | 1/2004 | Brownfield | H01L 23/49811 257/778 |
| 2004/0080043 A1 | * | 4/2004 | Tsai | H01L 23/49816 257/723 |
| 2006/0091509 A1 | * | 5/2006 | Zhao | H01L 23/055 257/678 |
| 2008/0006942 A1 | * | 1/2008 | Park | H01L 25/105 257/738 |

(Continued)

OTHER PUBLICATIONS

Bae et al., "Fine-Pitch, Low-volume SoP (Solder-on-Pad) Process", 2012 IEEE 14th Electronics Packaging Technology Conference, 5 pages.

(Continued)

*Primary Examiner* — Thao P Le
(74) *Attorney, Agent, or Firm* — Sheridan Ross P.C.

(57) ABSTRACT

A semiconductor package and methods for producing the same are described. One example of the semiconductor package is described to include a substrate having a first face and an opposing second face. The package is further described to include a plurality of pads disposed on the first face of the substrate, each of the plurality of pads including a first face and an opposing second face that is in contact with the first face of the substrate. The semiconductor package is further described to include a plurality of solder-on-pad structures provided on a first of the plurality of pads.

20 Claims, 8 Drawing Sheets

(56) References Cited

U.S. PATENT DOCUMENTS

2008/0280392 A1* 11/2008 Stapleton ............... C09J 163/00
                                                    438/106
2013/0009303 A1*  1/2013 Tsai ................... H01L 25/0652
                                                    257/737
2013/0228916 A1*  9/2013 Mawatari ................ H01L 24/81
                                                    257/737

OTHER PUBLICATIONS

Lee et al., "Characterization and Estimation of Solder-on-Pad Process for Fine-Pitch Applications", IEEE Transactions on Components, Packaging and Manufacturing Technology, vol. 4, No. 10, Oct. 2014, 10 pages.

Choi et al., "Novel Solder-on-Pad (SoP) Technology for Fine-Pitch Flip Chip Bonding", 2010 11th International Conference on Electronic Packaging Technology & High Density Packaging, 5 pages.

* cited by examiner

SEMICONDUCTOR PACKAGE HAVING A SOLDER-ON-PAD STRUCTURE

FIELD OF THE DISCLOSURE

The present disclosure is generally directed toward computing devices and the semiconductor packages used thereby.

BACKGROUND

Electronic devices such as integrated circuits and passive electronic devices are packaged in a variety of configurations. One known configuration involves the formation of a solder ball array on the exterior of the package to provide electrical communication between the package device and other components such as a Printed Circuit Board (PCB) or test socket. In such solder ball packaging, a series of solder balls are adhered to conductive leads from the packaged device and spatially arranged in an array (e.g., a grid of perpendicular rows and columns) with a solder ball at the column and row intersections.

Methods for mounting chips and other semiconductor packages on substrates known as "flip-chip techniques," in which the bottom surface of a die and a substrate are connected via bumps arranged in the form of an array, are conventionally well-known.

The current packaging trend is toward smaller form factors with higher chip integration into one chip module. This trend can issue design challenges for the routing in terms of substrate and assembly processes.

BRIEF DESCRIPTION OF THE DRAWINGS

The present disclosure is described in conjunction with the appended figures.

DETAILED DESCRIPTION

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, components, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another—although some features or elements may exhibit discrete changes as well. Thus, the elements illustrated in the drawings are schematic in nature and their shapes are not intended to be limited to the precise shape of an element and are not intended to limit the scope of the present disclosure.

It will be understood that when an element such as a region, component, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It is with respect to the above-noted shortcomings of the prior art that the features disclosed herein were contemplated. In particular, solutions are proposed to create solder-on-pad structures for solder pads. The disclosed solder-on-pad structures can be self-supporting and can help achieve fine pitch solder joints on a semiconductor package. More specifically, embodiments of the present disclosure propose solder-on-pad structures that help achieve smaller pad margins (e.g., spacings between solder pads), smaller package form factors, better and more reliable solder joints, as well as improved package performance. Consequentially, computing devices that employ such semiconductor packages can also realize many benefits including more functions executed on a single chip and improved functional performance.

Figure 1:
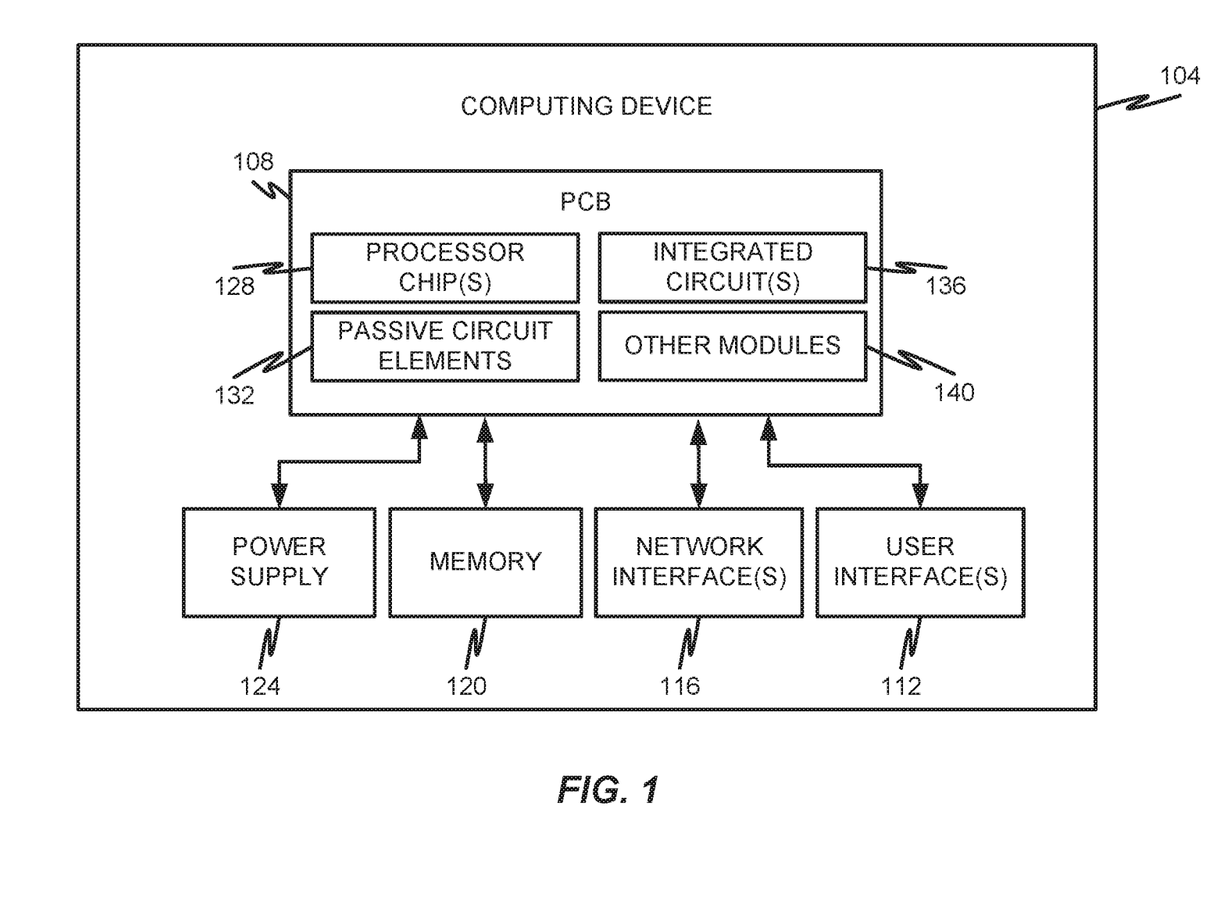
FIG. 1 is a block diagram depicting components of a computing device in accordance with at least some embodiments of the present disclosure.

With reference initially to a FIG. 1, an environment in which embodiments of the present disclosure can be utilized will be described. FIG. 1 depicts a computing device 104 having a Printed Circuit Board (PCB) 108 and a number of other components incorporated therein. The computing device 104 may correspond to any type of known device capable of performing analog and/or digital computing tasks. Examples of a computing device 104 include, without limitation, a Personal Computer (PC), laptop, tablet, cellular phone, smartphone, telephone, handheld video game console, Personal Digital Assistant (PDA), wearable device (e.g., smart watch, dedicated wearable device, wearable healthcare device, body monitoring equipment, etc.), and the like.

The computing device 104 is shown to include the PCB 108, user interface(s) 112, network interface(s) 116, computer memory 120, and a power supply 124. The PCB 108 is further shown to have one or more processor chips 128, integrated circuit 136, passive circuit element 132, and other modules 140 mounted thereon. The elements provided on the PCB 108 may be both physically attached to the PCB 108 and in electrical communication with the PCB 108. In some embodiments, the elements provided on the PCB 108 may be mounted to the PCB 108 using either Surface Mount Technologies (SMT) or thru-hole mount technologies that facilitate a physical and electrical connection between the elements and the PCB 108. Advantageously, the PCB 108 may also comprise electrical traces or circuit paths that enable electronic communications between the various elements mounted thereon as well as between the other components of the computing device 104. Although the interface(s) 112, network interface(s) 116, memory 120, and power supply 124 are shown as being separate from the PCB 108, it should be appreciated that these elements may also be mounted on the PCB 108.

The user interface(s) 112 may include one or more user input devices and/or one or more user output devices. Examples of suitable user input devices that may be included in the user interface(s) 112 include, without limitation, buttons, keyboards, mouse, touch-sensitive surfaces, pen, camera, microphone, etc. Examples of suitable user output devices that may be included in the user interface(s) 112 include, without limitation, display screens, touchscreens, lights, speakers, etc. It should be appreciated that the user interface 112 may also include a combined user input and user output device, such as a touch-sensitive display or the like.

The network interface(s) 116 may include hardware that facilitates communications with other communication devices over a communication network (e.g., a wireless or wired communication network). Accordingly, the network interface 116 may include an Ethernet port, a Wi-Fi card, a Network Interface Card (NIC), a cellular interface (e.g., antenna, filters, and associated circuitry), or the like. The network interface 116 may be configured to facilitate a connection between the computing device 104 and a communication network (e.g., cellular network, Local Area Network (LAN), wireless network (e.g., 802.11N network), etc.) and may further be configured to encode and decode communications (e.g., packets) according to a protocol utilized by the communication network. It should be appreciated that some aspects of the network interface 116 may actually be executed on a processor chip 128 or integrated circuit 136 (e.g., filtering functions, encoding/decoding functions, amplification functions), which means that the network interface 116 may correspond to the physical device(s) that facilitate network communications (e.g., antennas, network ports, etc.).

The memory 120 may correspond to any type of non-transitory computer-readable medium. In some embodiments, the memory 120 may comprise volatile or non-volatile memory and a controller for the same. Non-limiting examples of memory 120 that may be utilized in the computing device 104 include RAM, ROM, buffer memory, flash memory, solid-state memory, hard disk drives, or variants thereof.

The power supply 124 may include a built-in power supply (e.g., battery) and/or a power converter that facilitates the conversion of externally-supplied AC power into DC power that is used to power the various components of the computing device 104. In some embodiments, the power supply 124 may also include some implementation of surge protection circuitry to protect the components of the computing device from power surges.

The processor chip(s) 128 may correspond to one or many microprocessors that are used to execute instructions stored in memory 120 and in other locations. The processor chip(s) 128 may correspond to any type of known digital or analog processing device that enables the computing device 104 to execute some or all of its desired functions. In some embodiments, the processor chip 128 incorporates the functions of the computing device's Central Processing Unit (CPU) on a single Integrated Circuit (IC) or a few IC chips. The processor chip 128 may be a multipurpose, programmable device that accepts digital data as input, processes the digital data according to instructions stored in its internal memory, and provides results as output. The processor chip 128 may also implement sequential digital logic as it has internal memory. As with most known microprocessors, the processor chip 128 may operate on numbers and symbols represented in the binary numeral system.

The integrated circuit 136 may be similar or identical to the processor chip(s) 128, in that they may comprise a number of integrated circuit elements in a single package. Whereas the processor chip(s) 128 may execute high-level functions on behalf of the computing device 104, the integrated circuit(s) 136 may be used to execute more specific or low-level functions within the computing device 104. It should be appreciated, however, that the functions of the processor chip(s) 128 and integrated circuit(s) 136 may be combined into a single integrated circuit or chip package without departing from the scope of the present disclosure. In some embodiments, the integrated circuit(s) 136 may be configured to execute driver functions or other specific functions on behalf of certain components of the computing device 104. For instance, an integrated circuit 136 may be provided to facilitate the operation of the network interface 116. Such an integrated circuit 136 may perform the desired encoding/decoding functions, filtering functions, and other basic functions required to enable the network interface 116 to perform as desired.

The passive circuit elements 132 may correspond to known types of circuit elements that are connected to the PCB 108. Non-limiting examples of passive circuit elements 132 that may be connected to the PCB 108 include resistors, capacitors, inductors, diodes, transducers, sensors, detectors, and the like.

Figure 2:
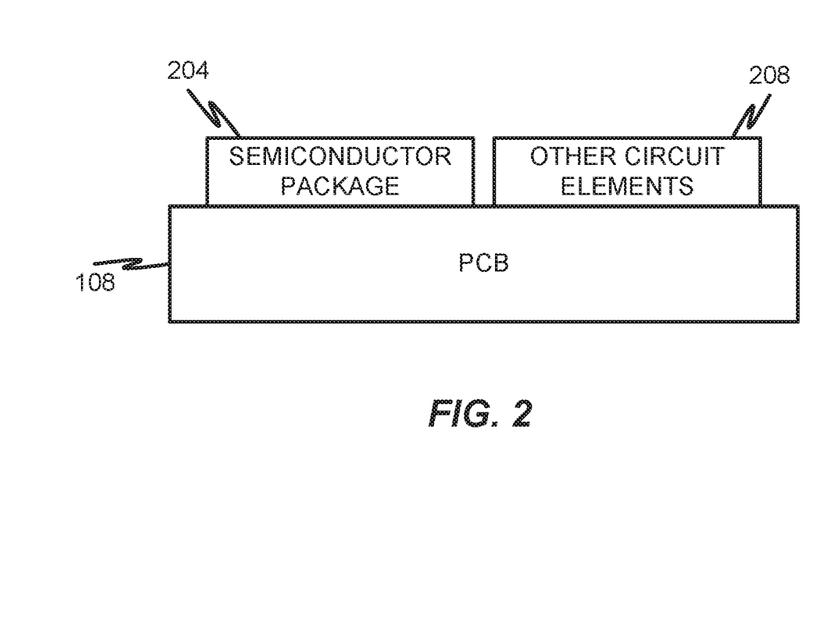
FIG. 2 is a block diagram depicting a PCB with components mounted thereon in accordance with at least some embodiments of the present disclosure.

The other modules 140 may include any other type of component that is connected to the PCB 108 and in electrical communication with other elements of the PCB 108. Other modules 140 may include speakers, buzzers, transformers, amplifiers, and the like As can be seen in FIG. 2, the PCB 108 may provide a physical support for semiconductor packages 204 and other circuit elements 208. The semiconductor package 204 may include any of the processor chips(s) 128, the integrated circuit(s) 136, or any other device mounted on the PCB 108 that comprises a package of circuit elements contained in a single package. The other circuit elements 208 may include the passive circuit elements 132 and other modules 140 that are mounted on the PCB 108. In addition to providing a physical support for the semiconductor package(s) 204 and other circuit elements 208, the PCB 108 may also provide electrical connectivity between the devices 204, 208. The electrical connectivity may be provided via electrically-conductive traces, wires, or combinations thereof. The material of the PCB 108 may be rigid or flexible as is known in the art. It should further be appreciated that the semiconductor package 204 and/or other circuit elements 208 may be mounted on the PCB 108 using SMT techniques, thru-hole mounting, or flip-chip techniques. As will be described in further detail herein, one or more of the semiconductor packages 204 may be mounted on the PCB 108 using flip-chip techniques by providing the semiconductor packages 204 with an array of pad assemblies formed thereon (e.g., as a Land Grid Array (LGA) configuration, Ball Grid Array (BGA) configuration, or the like).

Figure 3A:
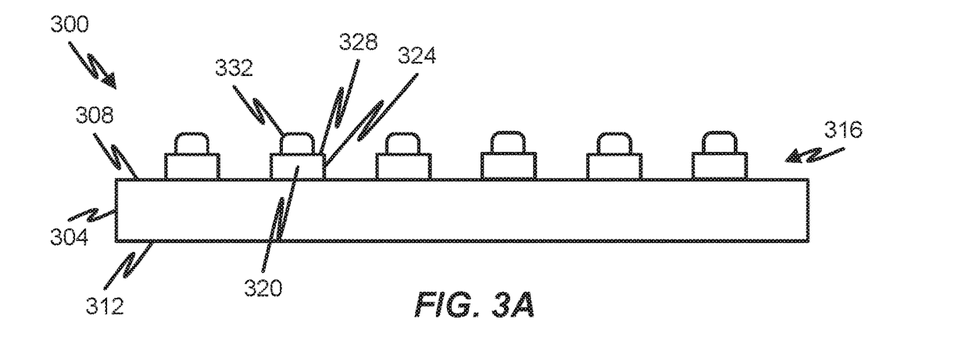
FIG. 3A is a side view depicting elements of a semiconductor package in a first assembly phase in accordance with at least some embodiments of the present disclosure.
Figure 3B:
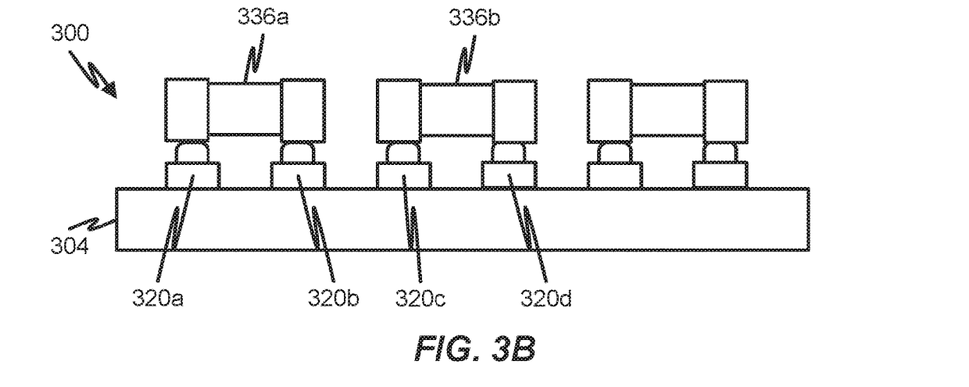
FIG. 3B is a side view depicting elements of a semiconductor package in a second assembly phase in accordance with at least some embodiments of the present disclosure.
Figure 3C:
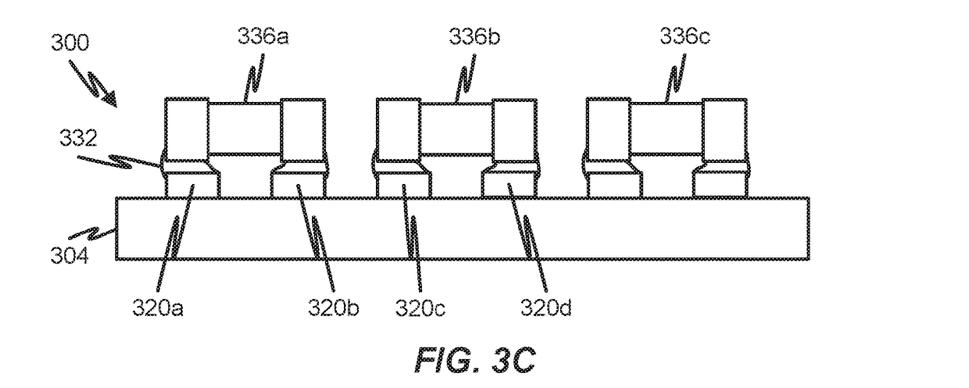
FIG. 3C is a side view depicting elements of a semiconductor package in a third assembly phase in accordance with at least some embodiments of the present disclosure.
Figure 4:
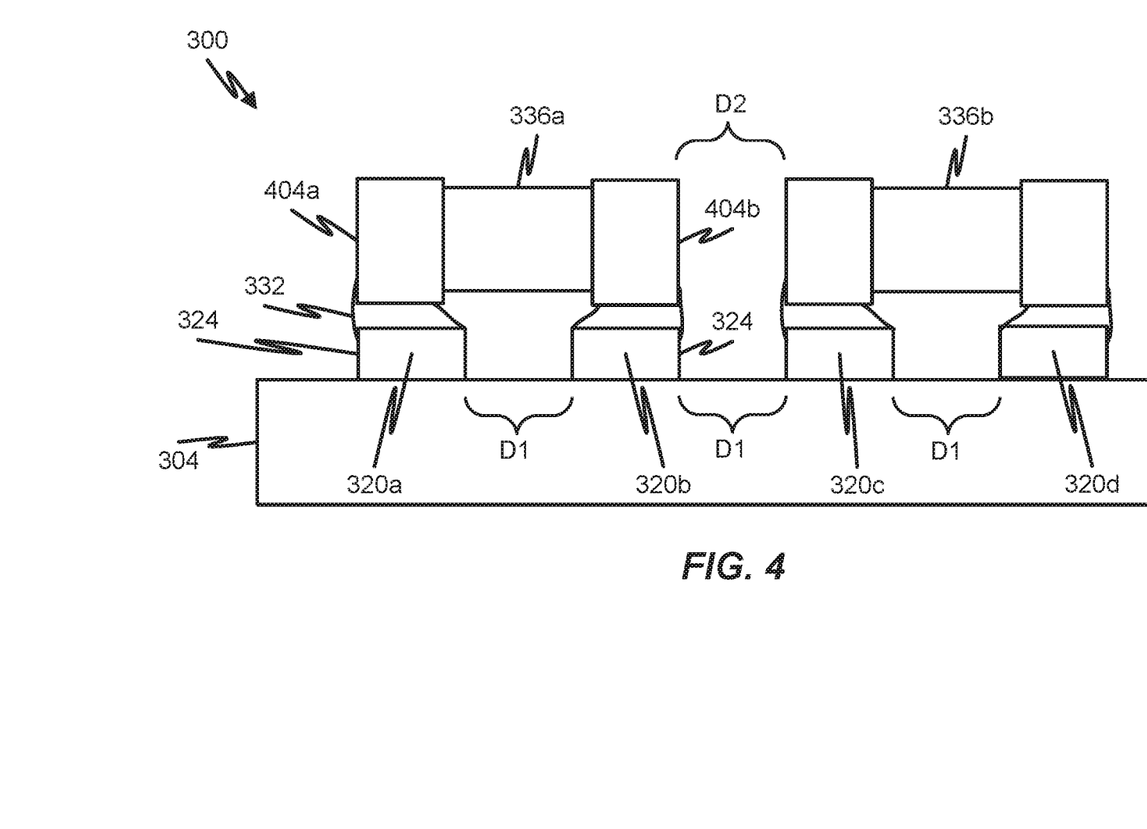
FIG. 4 is a close-up view of the semiconductor package from FIG. 3C with additional dimensions shown.

With reference now to FIGS. 3A thru 4, additional details of a semiconductor package 300 are shown in accordance with at least some embodiments of the present disclosure. The semiconductor package 300 may be similar or identical to the semiconductor package 204 and, therefore, may be integrated into a computing device 104. Moreover, the semiconductor package 204 may correspond to any type of semiconductor device or collection of devices that help facilitate or perform functions of a computing device 104.

The view of the semiconductor package 300 may correspond to a complete view of a semiconductor package or the semiconductor package 300 may correspond to a portion of a larger semiconductor package 204. In other words, the number of pad assemblies depicted on the semiconductor package 300 should not be construed as limiting embodiments of the present disclosure to any particular number or arrangement of pad assemblies.

The semiconductor package 300 is shown to include a substrate 304 with a plurality of pad assemblies 316 provided thereon. More specifically, the substrate 304 includes a first face 308 and an opposing second face 312. The first face 308 may include the plurality of pad assemblies 316 formed thereon. Although not depicted, the substrate 304 may include a number of conductive vias that electrically connect the plurality of pad assemblies 316 to pads or traces formed on the second face 312. The semiconductor package 300 is shown with the plurality of pad assemblies 316 facing upward, which may correspond to an orientation in which the package 300 is fabricated; however, as is known in flip-chip technologies, the semiconductor package 300 may be flipped over in its orientation such that the pad assemblies 316 face downward and are capable of being mounted onto the PCB 108. In other words, the orientation depicted in FIGS. 3A-3B should not be construed as limiting.

The substrate 304 may comprise a dielectric material or similar non-conductive material used for physically supporting the plurality of pad assemblies 316. As noted above, the substrate 304 may also include one or more electrically-conductive vias, electrically-conductive traces, and other components that enable various components mounted to the substrate 304 to communicate with one another. In general, it is desirable to utilize an electrically insulative material for the substrate 304.

Each pad assembly in the plurality of pad assemblies 316 may include a pad 320 with a solder-on-pad structure 332 provided on top of the pad 320. It should be appreciated that the plurality of pad assemblies 316 may include a large number of pads 320 distributed across the substrate 304 in a uniform or matrix configuration. It should also be appreciated that the pads 320 do not necessarily need to be configured in a uniform array or organized matrix of pads. To the contrary, the pads 320 may be distributed across the substrate 304 in any configuration—organized or unorganized.

In some embodiments, each pad assembly provides a single physical and electrical connection to an electrical node on a PCB 108. It should be appreciated that each pad assembly in the plurality of pad assemblies 316 is designed to be substantially co-planar with any other pad assembly on the substrate 304. Thus, the plurality of pad assemblies 316 provided on the substrate 304 may have substantially (e.g., within machining and/or processing tolerances) the same height as measured from the first face 308 of the substrate 304 to the top of the solder-on-pad structure 332. Such co-planarity helps to enable an efficient bonding with the PCB 108.

FIG. 3A further shows how the solder-on-pad structures 332 can be positioned on top of the pad 320. More specifically, each pad 320 may include one or more side edges 324 that are substantially perpendicular to the first face 308 of the substrate 304. The one or more side edges 324 may span between the first face 308 of the substrate 304 and a first face 328 of the pad 320. The first face 328 of the pad 320 may be oriented substantially parallel and not co-planar with the first face 308 of the substrate 304. In some embodiments, the first face 308 of the substrate 304 and the first face 328 of the pad 320 may be considered outward facing surfaces or faces that can eventually be oriented toward a PCB 108 for bonding thereto. Although not labeled, each pad 320 may also include a second face that substantially opposes the first face 328.

The material of the pads 320 may correspond to any conductive material. In some embodiments, the pads 320 may include a conductive metal such as copper, silver, gold, or the like.

The solder-on-pad structures 332 may be constructed from any type of solder material. In some embodiments, the solder material used for the solder-on-pad structures 332 may correspond to a solder paste, a conductive epoxy, or some other conductive liquid material. Alternatively or additionally, the solder material may be formed using solder balls (one or a plurality), which may be printed onto the pads 320 or otherwise deposited thereon. The solder material may be deposited directly on the first face 328 of the pad 320 or a flux material may be used to help the adhesion of the solder material to the pad 320. It should be appreciated that any type of electrically conductive material or combination of materials may be used as part of the solder material. Moreover, the solder-on-pad structures 332 may be substantially self-supporting, meaning that they do not require an additional retaining material (e.g., a solder resist) to maintain their distinct shape and configuration on the first face 328 of the pad 320. As will be discussed in further detail herein, this self-supporting solder-on-pad structure 332 results in at least a portion of the first face 328 of the pad 320 being exposed/uncovered by any material when the solder material is reflowed/melted to bond a circuit element to the pad 320. In some embodiments, the solder-on-pad structures 332 may include solder material that is deposited on the pad 320 using a solder print process. The solder material may then be reflowed, defluxed, and/or coined to achieve the final shape of the solder-on-pad structure.

FIGS. 3B and 3C show that circuit elements 336a, 336b may be mounted on the pads 320 via the solder-on-pad structures 332. In some embodiments, a circuit element (e.g., a first circuit element 336a and a second circuit element 336b) may be mounted on adjacent sets of pads 320a, 320b, 320c, 320d. The solder-on-pad structures 332 may then be reflowed such that the solder-on-pad structures 332 change from a solid state to a liquid or semi-liquid state, thereby bonding (physically and electrically) the circuit elements 336a, 336b to the pads 320 on which they are mounted. Because the solder-on-pad structures 332 are provided as discrete amounts of solder on the first face 328 of the pads 320, the likelihood of the solder material leaking or flowing down to the first face 308 of the substrate 304 or spanning between pads 320 is very low (e.g., almost negligible). Accordingly, the number of defective semiconductor packages 300 can be significantly reduced as compared to conventional solder-on-pad construction processes that utilize more solder material. It should be appreciated that the reflowed solder 332 may also correspond to or be referred to as a melted or semi-melted solder-on-pad structure 332).

Another advantage to utilizing the solder-on-pad structures 332 disclosed herein is that the need for pad margin (e.g., additional inward spacing of the circuit element 336a, 336b from the side edge of a pad) is minimized or eliminated. In particular, as can be seen in FIG. 3C and FIG. 4, the distance between adjacent pads (e.g., a pad spacing D1) can be substantially uniform from pad to pad, although such a spacing is not required. In some embodiments, the pad spacing D1 may be less than 20 microns or even less than 15 microns. This relatively narrow pad spacing D1 is possible because a discrete amount of solder material is used for the solder-on-pad structures 332. Using a discrete and minimal amount of solder material helps reduce the chances of solder material bridging between adjacent pads, thereby creating electrical shorts. Furthermore, conventional processes usually require the pad spacing to be at least 40-50 microns. It should be appreciated that by achieving a pad spacing D1 of less than 20 microns, the number of circuit elements 336 that can be packed into a single package 300 is greatly increased.

In addition, FIG. 4 shows that the circuit elements 336a, 336b may be mounted on the pas assemblies in such a way that a first side edge 404a of a circuit element 336a is substantially aligned or co-planar (e.g., in the vertical plane that is perpendicular to the first face 308 and/or first face 328) with a side edge 324 of one pad (e.g., the first pad 320a) while a second side edge 404b of the circuit element 336a is substantially aligned or co-planar (e.g., in the vertical plane) with a side edge 324 of another pad (e.g., the second pad 320b). This effectively results in a circuit element spacing D2 that is substantially equal to the pad spacing D1, at least within tolerances of a pick-and-place machine that positions the circuit elements 336a, 336b on the pads 320. In some embodiments, the circuit element spacing D2 is equal to the pad spacing D1 at least within a tolerance of +/−2 microns. It should be appreciated that thanks to the use of the solder-on-pad structures 320, the need for oversized pads 320 and pad margins between a side edge of the pad and the side edge of the circuit elements can be avoided. This helps to achieve smaller form factors for the package 300, increases design flexibility, and enables higher chip integration as compared to conventional semiconductor packages.

The circuit elements 336a, 336b may correspond to any type of passive or active circuit element that is desired to be mounted to the substrate 304. In some embodiments, the circuit elements 336a and/or 336b (or others not depicted) correspond to passive circuit elements, non-limiting examples of which include resistors, inductors, capacitors, diodes, etc. In some embodiments, the circuit elements 336a and/or 336b (or others not depicted) correspond to active circuit elements such as transistors, IC chips, and the like. Although depicted as having substantially flat side edges 404a, 404b, it should be appreciated that the circuit elements 336a, 336b do not necessarily need to exhibit flat side edges, but rather the furthest extent of the circuit elements 336a, 336b may be considered the side edges (even though they may be curved or non-linear).

Figure 5:
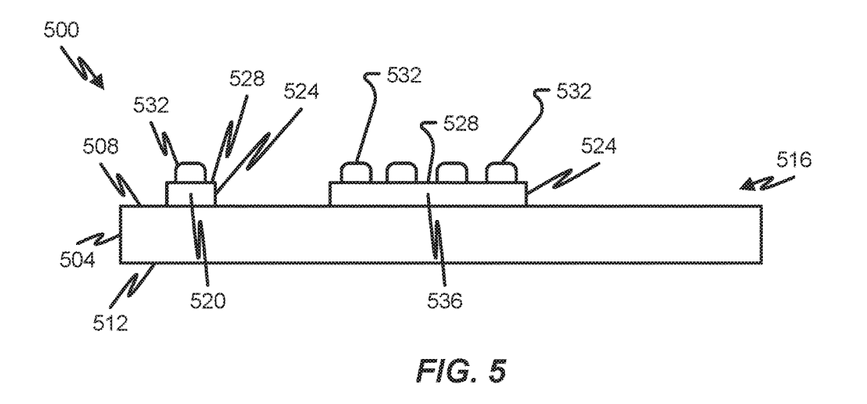
FIG. 5 is a side view depicting elements of a semiconductor package having a pad with multiple solder-on-pad structures deposited thereon in accordance with at least some embodiments of the present disclosure.

FIG. 5 depicts another semiconductor package 500 in accordance with at least some embodiments of the present disclosure. The semiconductor package 500 may have similar or identical features to the other semiconductor packages (e.g., package 300) described herein. In particular, the package 500 may include a substrate 504 having a first face 508 and opposing second face 512. The substrate 504 may be similar or identical to substrate 304.

The semiconductor package 500 also exhibits a plurality of pad assemblies 516 mounted on the substrate 504. The plurality of pad assemblies 516 include one or more pads 520 having a single solder-on-pad structure 532 provided thereon and one or more pads 536 having multiple solder-on-pad structures 532 provided thereon. The materials used to construct the pads 520, 536 may be similar or identical to the materials used for pads 320. Furthermore, the pads 520, 536 both possess first faces 528 that are substantially co-planar with one another. The first faces 528 of the pads 520, 536 may be perpendicular to side edges 524 of the pads 520, 536, which are substantially perpendicular to the first face 508 of the substrate 504.

The first face 528 of pad 520 may have a smaller surface area than the first face 528 of pad 536. Thus, the first face 528 of pad 536 may be sufficiently sized to have multiple solder-on-pad structures 532 provided thereon. The multiple discrete solder-on-pad structures 532 can help create a better solder joint on the larger pad 536. In particular, the larger pad 536 may have multiple solder-on-pad structures 532 provided thereon to meet a desired solder volume for a solder joint if a single solder-on-pad structure 532 would be insufficient for creating a solder joint between the pad 536 and a circuit element.

Although not depicted, it should be appreciated that a single circuit element may be bonded between pads of the same type (e.g., between two larger pads 536) or between pads of different types (e.g., between a smaller pad 520 and a larger pad 536). Furthermore, the side edges of the circuit element may still be substantially aligned with side edges 524 of one or both of the pads 520, 536. The pad spacing, however, may need to be adjusted so as to accommodate the inclusion of larger pads 536 among smaller pads 520.

FIGS. 6A-6E depict further examples of pad assemblies 604 that can be created in accordance with at least some embodiments of the present disclosure. The various pad assemblies 604 may be utilized in any type of package or semiconductor device described herein. Furthermore, different types of pad assemblies 604 or configurations thereof may be used within the same package. The various configurations of pad assemblies 604 are meant to illustrate that embodiments of the present disclosure are not limited to a particular pad assembly configuration and the claims are similarly not so limited.

Figure 6A:
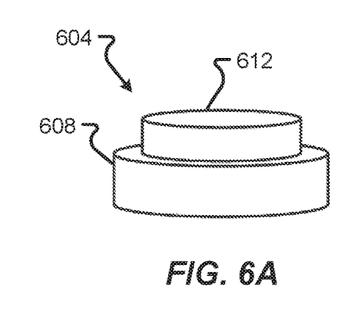
FIG. 6A is a perspective view of a pad assembly having a first possible configuration in accordance with at least some embodiments of the present disclosure.

A first configuration of an illustrative pad assembly 604 is shown in FIG. 6A where both the pad 608 and the solder-on-pad structure 612 exhibit a substantially cylindrical shape. The isometric view of FIG. 6A also helps to illustrate that some surface area of the first face of the pad 608 is left uncovered by the solder-on-pad structure 612 (or any other material). Thus, the solder-on-pad structure 612 has a smaller volume than the pad 608 and covers less than all of the first face of the pad 608. Although the solder-on-pad structures 612 depicted herein as shown to be substantially centered on the first face of the pad 608, it should be appreciated that off-centered configurations are also possible. Further still, different shapes and/or sizes of solder-on-pad structures 612 may be provided on different pads 608 that are attached to a common substrate. This means that solder-on-pad structures 612 can be tailored (by size and/or shape) to the specific pad on which they are deposited.

Figure 6B:
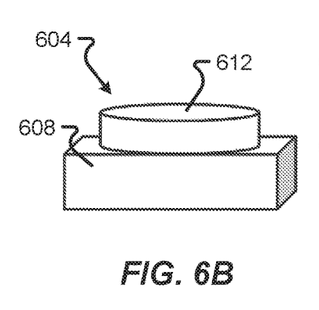
FIG. 6B is a perspective view of a pad assembly having a second possible configuration in accordance with at least some embodiments of the present disclosure.
Figure 6C:
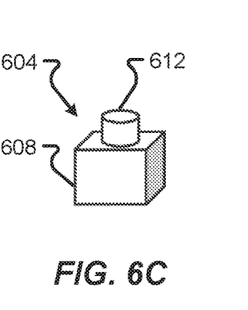
FIG. 6C is a perspective view of a pad assembly having a third possible configuration in accordance with at least some embodiments of the present disclosure.

FIG. 6B illustrates a configuration where the pad assembly 604 includes a substantially box-shaped pad 608 and an elongated cylinder solder-on-pad structure 608. FIG. 6C shows a more specific variation where the pad 608 is substantially cube-shaped and the solder-on-pad structure 620 is a relatively smaller cylindrical shape.

Figure 6D:
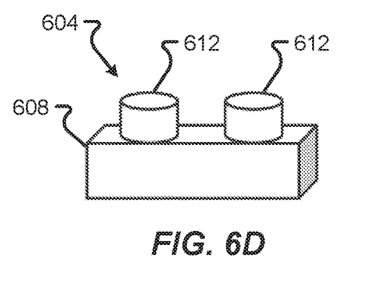
FIG. 6D is a perspective view of a pad assembly having a fourth possible configuration in accordance with at least some embodiments of the present disclosure.

FIG. 6D shows the pad assembly 604 having a pad 608 with multiple solder-on-pad structures 612 provided thereon. The solder-on-pad structures 612 are shown to be the same size and shape, but this is not a requirement of the present disclosure. Instead, two differently sized and/or shaped solder-on-pad structures 612 may be provided on a common pad 608.

Figure 6E:
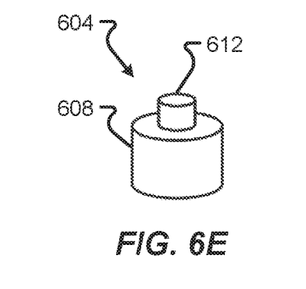
FIG. 6E is a perspective view of a pad assembly having a fifth possible configuration in accordance with at least some embodiments of the present disclosure.

Finally, FIG. 6E illustrates the pad assembly 604 having smaller a cylindrical pad 608 and smaller cylindrical solder-on-pad structure 612 as compared to the assembly of FIG. 6A. Although the various pad assemblies 604 are shown with specific combinations of pads 608 and solder-on-pad structures 612, it should be appreciated that any combination of pad shapes/sizes and solder-on-pad shapes/sizes can be used to form a particular pad assembly. Further, the shapes of the pads 608 and/or solder-on-pad structures 612 are not intended to be limited to cylindrical and box/cube-shapes. Rather, the shapes of the pads 608 and/or solder-on-pad structures 612 can be adjusted or controlled depending upon the design requirements of the package.

Figure 7:
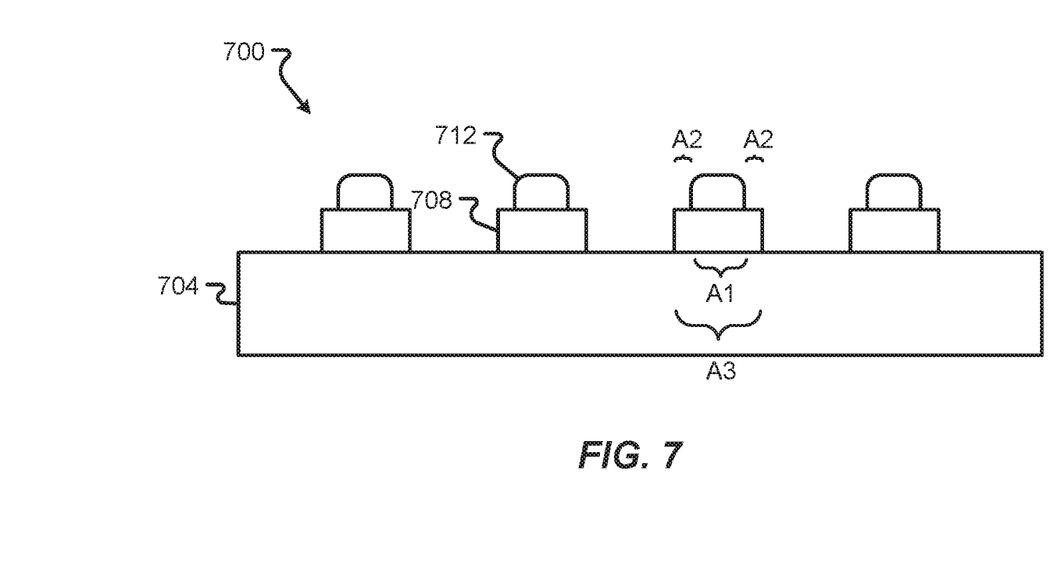
FIG. 7 is a side view of a semiconductor package in accordance with at least some embodiments of the present disclosure.

With reference now to FIG. 7, additional details regarding dimensions of the components of a pad assembly will be described in accordance with at least some embodiments of the present disclosure. FIG. 7 shows another example of a semiconductor package 700, which may be similar or identical to the other packages (e.g., 204, 300, 500) depicted and described herein. The semiconductor package 700 is shown to include a substrate 704 having the plurality of pad assemblies provided thereon. Each of the pad assemblies includes a pad 708 and a solder-on-pad structure 712. A first area A1 of the top surface of the pad 708 is covered by the solder-on-pad structure 712. A second area A2 of the top surface of the pad 708 is left uncovered by the solder-on-pad structure 712. The sum of the first area A1 and the second area A2 is the total area A3 of the top surface of the pad 708. In some embodiments, the covered area A1 is approximately at least 75% the total area A3. In some embodiments, the covered area A1 may constitute between 50% and 75% the total area A3. It should be appreciated that for a pad 708 having multiple solder-on-pad structures thereon, the amount of covered area A1 as compared to the total area A3 may be even lower (e.g., between 40% and 50%). Although the covered area A1 is shown to be completely circumscribed by the uncovered area A2, it should be appreciated that such a configuration is not required and the solder-on-pad structure 712 may be placed at an edge of the top surface of the pad 708 if desired.

Figure 8:
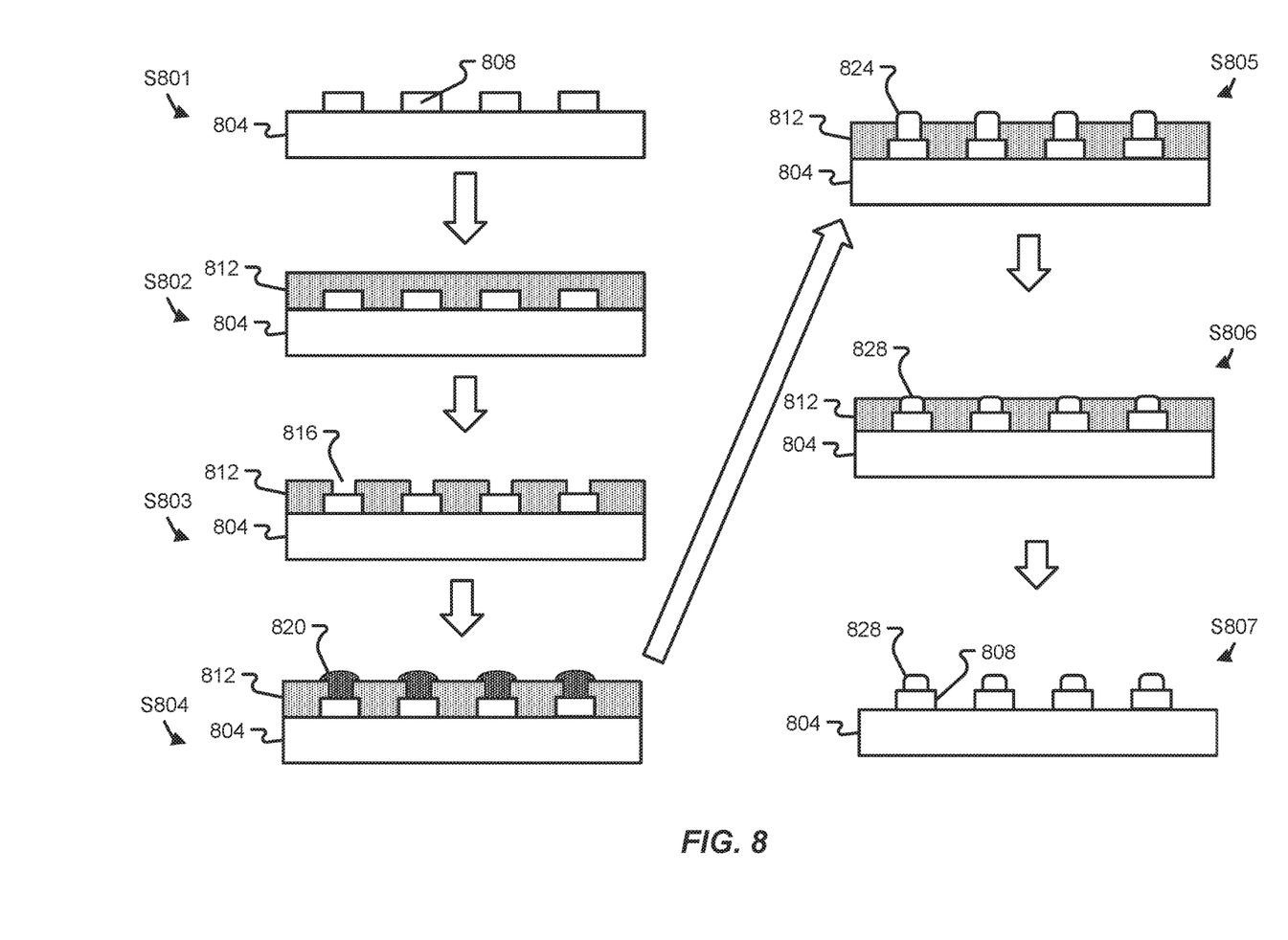
FIG. 8 depicts a process for manufacturing a semiconductor package in accordance with at least some embodiments of the present disclosure.

With reference now to FIG. 8, a process of manufacturing a semiconductor package will be described in accordance with at least some embodiments of the present disclosure. The process described herein can be used to produce any of the semiconductor packages or portions thereof described herein. Moreover, one or more of the steps described herein may be combined with other steps, performed in a different order, or omitted as such steps may be optional.

The process begins by depositing a plurality of pads 808 on a substrate 804 (step S801). In some embodiments, the pads 808 may be deposited on the substrate 804 by using a single deposition step or by using a plurality of steps which ultimately result in the establishment of the metallic/electrically conductive pad 808 on the substrate 804.

The process continues by placing a sacrificial material 812 over the entirety of the substrate 804 and the pads 808 (step S802). The sacrificial material 812 may correspond to any type of material or compound that is capable of maintaining its shape and structure, is capable of laser ablation/chemical etching/mechanical etching, or the like. In some embodiments, the sacrificial material 812 includes a liquid or film.

The process then continues by forming a plurality of opening areas 816 coincident with the top surfaces of the pads 808 (step S803). In particular, portions of the sacrificial material 812 overlying the pads 808 may be removed by exposing some, but not all of the sacrificial material 812, to UV radiation. In a UV-exposure scenario, the portions of the sacrificial material 812 that are desired to remain (e.g., have the opening area 816 provided between them) are exposed to the UV radiation whereas the portions of the sacrificial material 812 coincident with the opening area 816 are not exposed. This results in a curing of the exposed sacrificial material 812 and the rest of the sacrificial material 812 is left in a liquid state to be removed. Alternatively or additionally, the sacrificial material 812 may correspond to a film that is laser ablated, machine etched, or the like. In this scenario, the portions of the sacrificial material 812 coincident with the opening area 816 may be the portions that are ablated or otherwise treated to create the opening 816.

The process further continues by depositing a solder material 820 into the openings 816, thereby creating a contact between the solder material 820 and the pads 808 (step S804). In some embodiments, the solder material is deposited using a solder printing process, a screen printing process, or any other deposition technique (e.g., Chemical Vapor Deposition (CVD), Atomic Layer Deposition (ALD), etc.). At this point, the solder material 820 is not yet fixed, but rather may be in a liquid or semi-liquid state.

Accordingly, the process continues by reflowing and/or defluxing the solder material to create a reflowed solder material 824 (step S805). In this step (or series of steps), the solder material 820 is transformed into a structurally self-supporting solder material 824 that is capable of supporting its own weight and shape without assistance from the sacrificial material 812 or any other material (e.g., a solder resist). This is advantageous because the utilization of a solder resist (and leaving of the solder resist on the package) may result in deleterious effects on the performance of the package. For instance, if the package is used to perform RF functions, the remaining solder resist that supports the solder may have a negative impact on the RF performance of the package. It is, therefore, desirable to achieve a semiconductor package that does not necessarily need to have the solder resist remain after the manufacturing process is complete and the semiconductor package is bonded to a PCB 108.

The reflowed solder material 824 may then be coined or otherwise planarized in an optional coining step (step S806). The coining process is an optional one since the production of the solder-on-pad structures in step S805 may already result in solder-on-pad structures that are substantially co-planar with one another.

The process then continues by removing or stripping the sacrificial material 812 away from the substrate 804 (step S807). In some embodiments, the sacrificial material 812 may be removed using chemical, mechanical, or other techniques. At this point, the semiconductor package now has a plurality of pad assemblies with solder-on-pad structures 828. The solder-on-pad structures 828 are effectively self-supporting and ready to connect other circuit elements to the pads 808 via a separate connection and reflow process.

Figure 9:
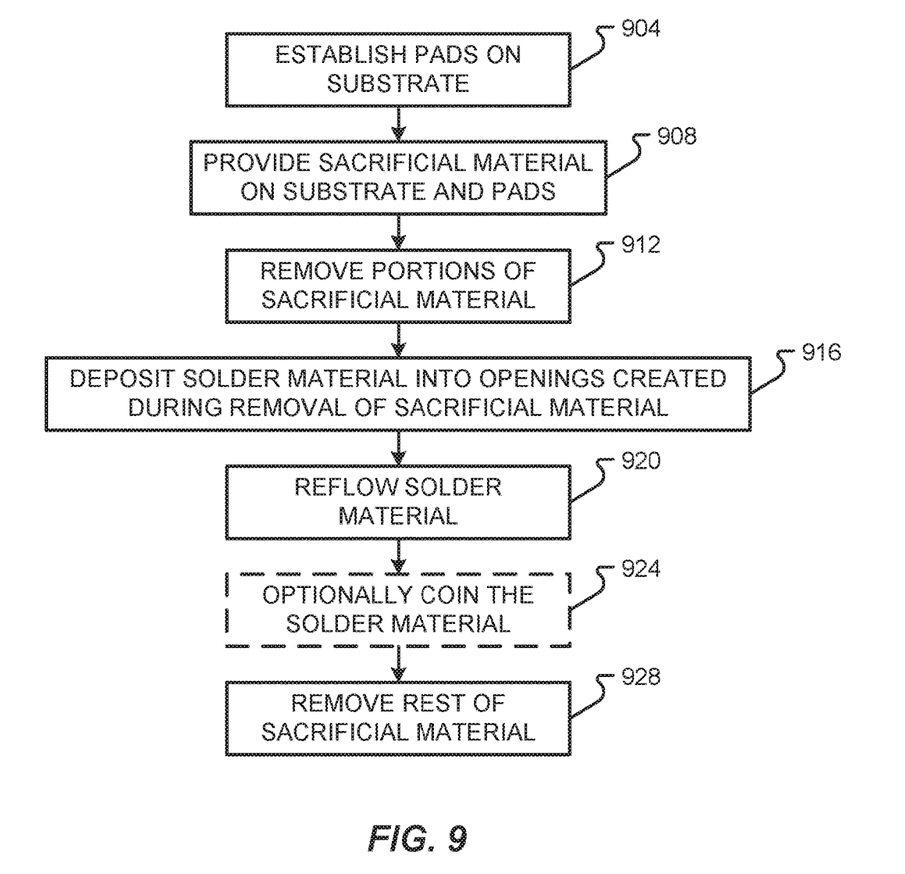
FIG. 9 is a flow chart depicting a method of manufacturing a semiconductor package in accordance with at least some embodiments of the present disclosure.

With reference now to FIG. 9, a method of manufacturing a semiconductor package will be described in accordance with at least some embodiments of the present disclosure. The method begins by establishing a plurality of pads on a substrate (step 904). The plurality of pads may be established in an array-type format, such as a LGA or the like. The pads may be established on the substrate using any type of known material deposition technique and the pads may be formed on the substrate in a single step or in a series of steps that ultimately results in the establishment of the pads, which may be electrically conductive, on the substrate.

The method continues by providing a sacrificial material on the substrate and pads (step 908). Suitable examples of a sacrificial material include, without limitation, dry film resist having a photosensitive ingredient therein, a solder resist material, or the like. In some embodiments, portions of the sacrificial material may then be removed, thereby establishing openings in the sacrificial material (step 912). The sacrificial material may be partially removed using any type of material removal technique such as laser ablation, chemical etching, mechanical etching, etc.

Thereafter, a solder material may be deposited into the openings created via the removal of the sacrificial material (step 916). The solder material may be deposited in a liquid, semi-liquid, powder, or similar type of state in which the solder material is somewhat malleable and capable of filling the openings in the sacrificial material.

The solder material is then reflowed or otherwise cured (step 920). In this step, the solder material is changed into a self-supporting solder material. The reflowed solder material may then be optionally coined (step 924) such that the height of the solder bumps is set to a substantially common plane and/or height from the top surface of the substrate.

The method then proceeds by removing the rest (some or all) of the sacrificial material that was not removed during step 912 (step 928). In this step, the reflowed and self-supporting solder material remains on the surface of the substrate and the majority of the sacrificial material is removed. In some embodiments, the entirety of the sacrificial material is removed whereas, in other embodiments, some but not all of the sacrificial material is removed from the substrate.

In some embodiments, a computing device is described and provided that includes a semiconductor package having:
 a substrate comprising a first face and an opposing second face;
 a first pad disposed on the first face of the substrate;
 a second pad disposed on the first face of the substrate; and
 a first circuit element connected between the first pad and the second pad, wherein a side edge of the first circuit element substantially aligns with a side edge of at least one of the first pad and the second pad.

The described computing device may further have a first side edge of the first circuit element that is substantially aligned with a first side edge of the first pad and a second side edge of the first circuit element that is substantially aligned with a first side edge of the second pad.

The described computing device may further have the first circuit element be physically bonded and electrically connected to the first pad by a first and a second solder-on-pad structure.

The described computing device may further have the first circuit element include a passive circuit element.

The semiconductor package of the described computing device may further include:
 a third pad disposed on the first face of the substrate;
 a fourth pad disposed on the first face of the substrate; and
 a second circuit element connected between the third pad and the fourth pad, where a side edge of the second circuit element substantially aligns with a side edge of at least one of the third pad and the fourth pad.

The described computing device may further have a lateral distance between the first circuit element and the second circuit element that is substantially equal to a lateral distance between the first pad and the third pad.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A semiconductor package, comprising:
a substrate comprising a first face and an opposing second face;
at least one pad provided on the first face of the substrate, the at least one pad comprising an outward facing surface that is substantially parallel and non-overlapping with the first face of the substrate and one or more side edges that separate the outward facing surface from the first face of the substrate, and wherein the at least one pad provides electrical connectivity to other electrical components mounted to the substrate; and
at least one solder-on-pad structure formed on the outward facing surface of the at least one pad, wherein the at least one solder-on-pad structure covers and overlaps a first portion of the outward facing surface, and wherein a second portion of the outward facing surface is not overlapped by the at least one solder-on-pad structure and is exposed prior to the at least one solder-on-pad structure being connected to a Printed Circuit Board (PCB).

2. The semiconductor package of claim 1, wherein the second portion of the outward facing surface is adjacent to the first portion of the outward facing surface and is exposed to environmental conditions.

3. The semiconductor package of claim 1, further comprising a first circuit element mounted on the at least one pad via the at least one solder-on-pad structure.

4. The semiconductor package of claim 3, wherein the first circuit element comprises a passive circuit element.

5. The semiconductor package of claim 3, wherein a side edge of the first circuit element is substantially aligned with a side edge of the at least one pad.

6. The semiconductor package of claim 1, wherein the at least one pad comprises a plurality of pads formed in an array.

7. The semiconductor package of claim 1, wherein the at least one pad comprises a first solder-on-pad structure and a second solder-on-pad structure deposited on the outward facing surface.

8. The semiconductor package of claim 1, wherein the at least one solder-on-pad structure is formed directly on the outward facing surface of the at least one pad by printing material of the at least one solder-on-pad structure onto the outward facing surface of the at least one pad.

9. The semiconductor package of claim 1, wherein a flux material is used to help adhesion of the at least one solder-on-pad structure to the outward facing surface of the at least one pad.

10. The semiconductor package of claim 1, wherein the solder-on-pad structure is coined.

11. The semiconductor package of claim 3, wherein the first circuit element comprises a first side edge and a second side edge, wherein the at least one pad comprises a first pad and a second pad, and wherein the first circuit element is connected between the first pad and the second pad.

12. The semiconductor package of claim 11, wherein the first circuit element comprises a passive circuit element having only two electrical terminals for external electrical connections.

13. The semiconductor package of claim 12, wherein a first side edge of the first circuit element is substantially aligned with a first side edge of the first pad and wherein a second side edge of the first circuit element is substantially aligned with a first side edge of the second pad.

14. The semiconductor package of claim 13, wherein the first side edge of the first circuit element and the second side edge of the first circuit element are substantially perpendicular with respect to the first face of the substrate.

15. The semiconductor package of claim 13, further comprising a second circuit element, wherein a spacing between the first circuit element and the second circuit element is substantially equal to a spacing between the first pad and the second pad.

16. The semiconductor package of claim 11, wherein the first pad and the second pad are surrounded by a dielectric material that is substantially devoid of a solder resist material.

17. The semiconductor package of claim 1, wherein the substrate comprises a residue of a sacrifice material adjacent to the at least one pad.

18. The semiconductor package of claim 1, wherein the at least one solder-on-pad structure is formed directly on the outward facing surface of the at least one pad prior to having a circuit element connected thereto.

19. The semiconductor package of claim 1, wherein the one or more side edges of the at least one pad are substantially flat.

20. The semiconductor package of claim 1, wherein the one or more side edges of the at least one pad are substantially curved.

* * * * *